United States Patent [19]
Cronin et al.

[11] Patent Number: 5,872,025
[45] Date of Patent: Feb. 16, 1999

[54] METHOD FOR STACKED THREE DIMENSIONAL DEVICE MANUFACTURE

[75] Inventors: John E. Cronin, Georgia; Anthony Palagonia, Underhill; Bernadette A. Pierson, South Hero; Dennis A. Schmidt, South Burlington, all of Vt.

[73] Assignee: International Business Machines Corporation, Armonk, N.Y.

[21] Appl. No.: 815,452

[22] Filed: Mar. 11, 1997

Related U.S. Application Data

[63] Continuation-in-part of Ser. No. 507,186, Jul. 26, 1995, Pat. No. 5,691,248.

[51] Int. Cl.$^6$ .......................... H01L 21/283; H01L 21/18; H01L 21/027; H01L 21/31
[52] U.S. Cl. .......................... 438/109; 438/106; 438/15; 438/459; 438/977; 257/686; 257/777; 361/735
[58] Field of Search .......................... 438/15, 107, 459, 438/977, 106, 109, 128, 997, 211, 368

[56] References Cited

U.S. PATENT DOCUMENTS

| | | |
|---|---|---|
| 4,754,316 | 6/1988 | Reid . |
| 4,784,970 | 11/1988 | Solomon . |
| 4,807,021 | 2/1989 | Okumura . |
| 4,818,728 | 4/1989 | Rai et al. . |
| 4,893,174 | 1/1990 | Yamada et al. . |
| 4,954,458 | 9/1990 | Reid . |
| 5,019,943 | 5/1991 | Fassbender et al. . |
| 5,266,511 | 11/1993 | Takao . |
| 5,408,123 | 4/1995 | Murai . |
| 5,455,445 | 10/1995 | Kurtz et al. . |
| 5,478,781 | 12/1995 | Bertin et al. . |
| 5,517,754 | 5/1996 | Beilstein, Jr. et al. . |
| 5,532,519 | 7/1996 | Bertin et al. . |
| 5,688,721 | 11/1997 | Johnson ................................ 437/208 |
| 5,702,984 | 12/1997 | Bertin et al. ............................ 437/208 |
| 5,712,190 | 1/1998 | Bertin et al. ............................ 437/173 |

*Primary Examiner*—Charles Bowers
*Assistant Examiner*—David S. Blum
*Attorney, Agent, or Firm*—Whitham, Curtis & Whitham; Eugene I. Shkurko, Esq.

[57] ABSTRACT

Stacked three-dimensional devices can be prepared by stacking wafers as an alternative to stacking individual devices. Chip regions are formed on several wafers with each chip region being surrounded by a separation region, such as an insulator filled trench. The wafers are then stacked with the chip regions in alignment. Aligning the wafers can be facilitated using notched regions in the periphery of the wafers. The wafers are then joined together by lamination. After laminating the stacks of wafers, stacks of chips are separated by etching, dicing or other processes, which separate out stacked chip devices from the stacked wafer at the chip separation regions. The process allows several stacked chip devices to be manufactured simultaneously.

12 Claims, 3 Drawing Sheets

METHOD FOR STACKED THREE DIMENSIONAL DEVICE MANUFACTURE

CROSS-REFERENCE TO RELATED APPLICATION

This application is a continuation-in-part of application Ser. No. 08/507,186 filed Jul. 26, 1995, now U.S. Pat. No. 5,691,248, and the complete contents of that application is herein incorporated by reference.

DESCRIPTION BACKGROUND OF THE INVENTION

1. Field of the Invention

The present invention generally relates to semiconductor chip manufacture, and more particularly to methods of making stacks of chips by lamination of wafers.

2. Background Description

Since the development of integrated circuit technology, computers and computer storage devices have been made from wafers of semiconductor material comprising a plurality of integrated circuits. After a wafer is made, the circuits are typically separated from each other by dicing the wafer into small chips, each containing one or more circuits. Thereafter, the individual chips are bonded to carriers of various types, and interconnected by wires to form modules. Such "two-dimensional" modules of chips fail to optimize the number of circuits that may be packaged in a given space and introduce undesirable signal delays, capacitance, and inductance as signals travel between chips.

Recently, three-dimensional arrays of chips have emerged as an important packaging approach. A typical multichip electronic module comprises multiple integrated circuit (IC) chips adhesively secured together as a monolithic structure. A metallization pattern is often provided directly on one (or more) side surface(s) of the module for IC chip interconnections and for electrical connection of IC chips to circuitry external to the module. The metallization pattern can include both individual contacts and bussed contacts. Multichip modules comprising stacks of IC chips are referred to herein as "stacks".

The current stack fabrication process suffers from problems that negatively effect overall stack manufacturing yield and efficiency. As a result, stack manufacturing costs remain high and profit margins remain low. Several of these problems involve: (1) IC chips becoming unusable in the stacks due to edge chipping during wafer dicing; (2) difficult side-surface channel via fabrication; (3) side-surface polyimide edge bead thickness; and (4) variable T-connect quality.

In addition, the current stack fabrication process requires much tighter dicing tolerance than is currently required for IC chip dicing associated with single IC chip, plastic encapsulation type packaging. The dicing tolerance for plastic packaging is approximately, for example, ±20 µm, while the stack process requires a dicing tolerance of approximately, for example, ±5 µm.

When IC chips of inadequate tolerance are stacked and laminated, the varying IC chip sizes result in IC chips shifting within the stack. Such shifting causes misalignment of, for example, the transfer metal leads of the IC chip in the stack. Accordingly, the side-surface of the stack requires polishing to expose all of the transfer metal leads, thereby reducing the total number of times that the stack side-surface can be reworked. Furthermore, the misalignment of the IC chips results in wider side-surface wiring being required to "capture" all the side-surface connections. Side-surface wiring density is therefore reduced.

As yet another problem, the varying IC chip sizes force the stack/lamination fixture used for assembly of the stack to be large enough to accommodate IC chips of varying sizes up to the maximum specification limit. This increases the likelihood of IC chip shifting. Moreover, the forces on the stack during lamination are concentrated on the largest chips in the stack because they are in direct contact with the sides of the lamination fixture. Therefore, these large chips tend to become damaged during lamination. This further compromises stack yield and requires increased side-surface polishing.

SUMMARY OF THE INVENTION

It is an object of this invention to provide a new and improved method of making three-dimensional arrays of chips.

It is another object of this invention to provide a method in which several three-dimensional arrays can be produced simultaneously.

The method of the present invention involves several steps beginning with forming chips on several wafers. As the wafers are processed an oxide ring is formed between each chip. The wafers are then stacked, matching notches on the periphery of each wafer, and then laminated. After laminating the stacks of wafers, stacks of chips are separated from the laminated wafer structure by etching, dicing, combinations thereof (i.e., dicing followed by etching), or by other process.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1:
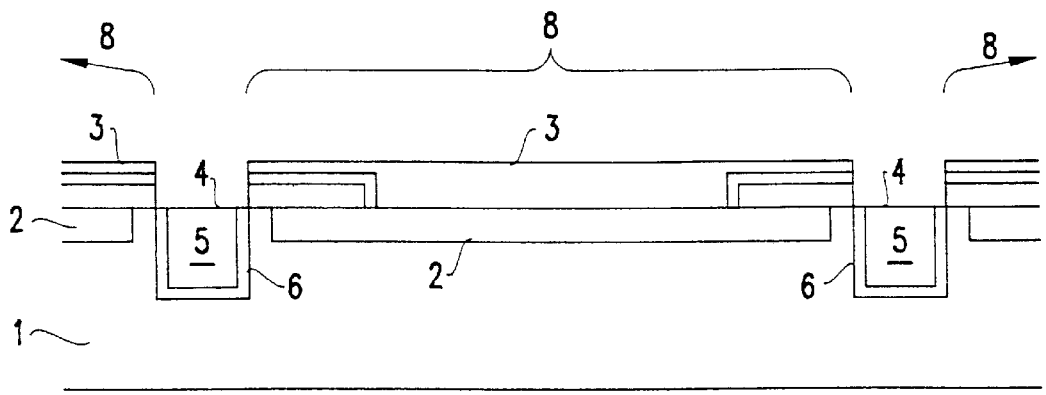
FIG. 1 is a cross sectional view of a wafer at the beginning of the fabrication process.
Figure 7:
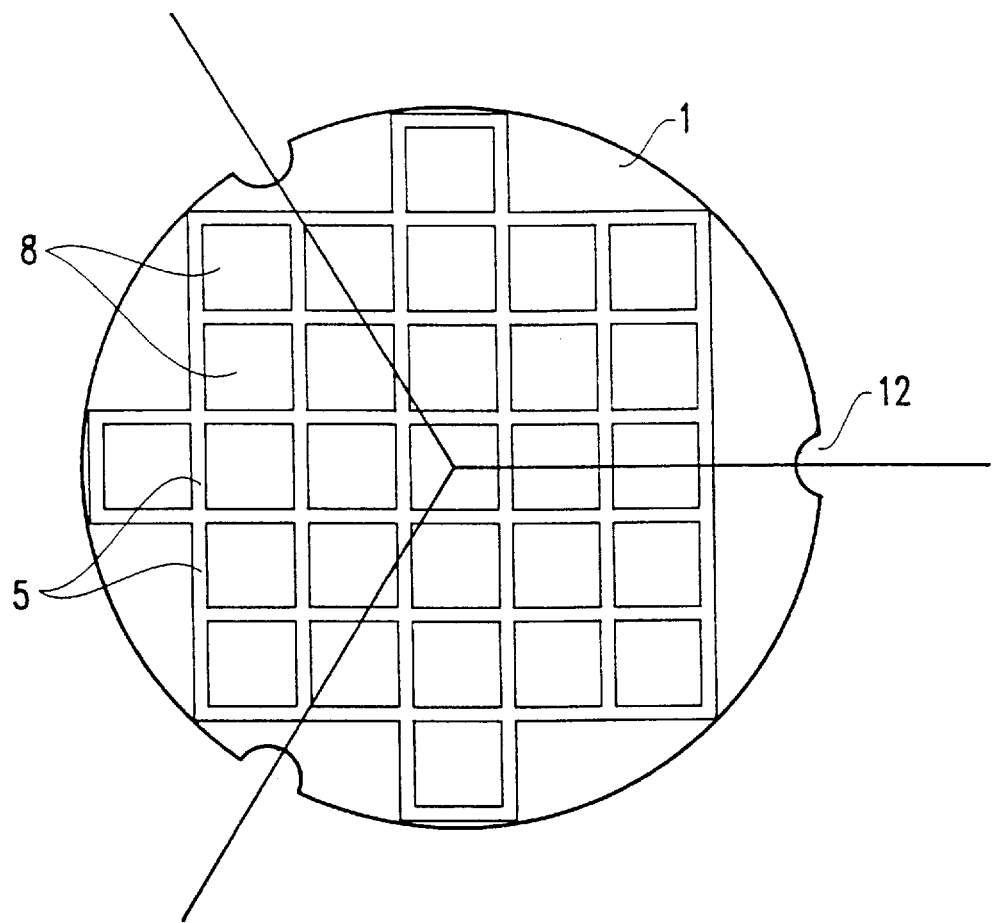
FIG. 7 is a top view of a wafer showing division of the wafer into device regions.

Referring now to the drawings, and more particularly to FIG. 1, there is shown a cross-section of a portion of a wafer 1, having active device layers 2 and cube transfer layers 3. In addition, oxide 4 fills trenches 5 which are lined with nitride 6 in the silicon wafer 1. A top view of the prepared wafer is shown in FIG. 7. As can be seen in FIG. 7, the oxide filled trench 5 surrounds each chip 8 in the wafer 1.

Figure 2:
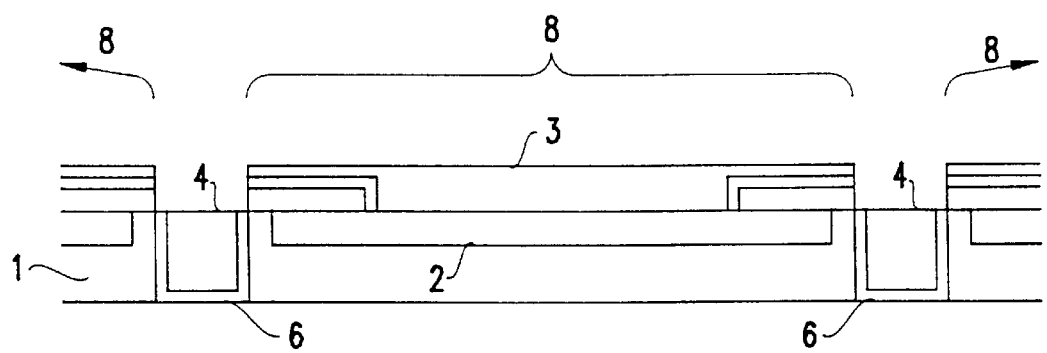
FIG. 2 is a cross sectional view of the wafer after backside polish.
Figure 3:
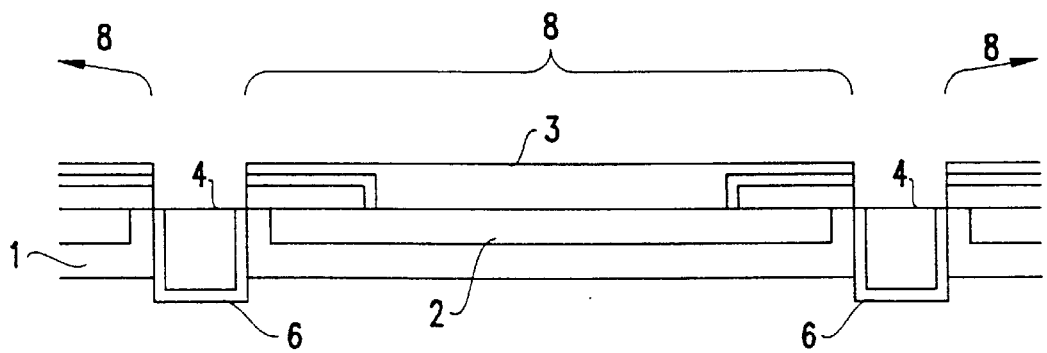
FIG. 3 is a cross sectional view of the wafer after a selective etch of silicon.
Figure 4:
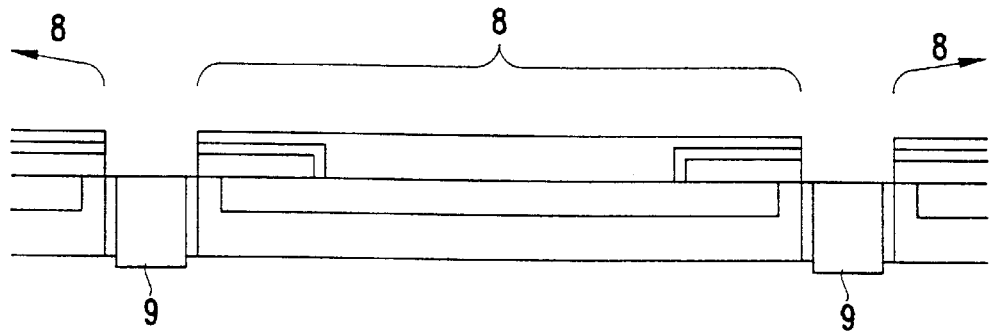
FIG. 4 is a cross sectional view of the wafer after a selective etch of nitride.

In the practice of this invention, a plurality of wafers 1 are created, each of which includes a plurality of chips 8 surrounded by oxide filled trenches 5. Upon creation of these wafers 1, a backside polish is performed to expose the nitride liner 6. As can be seen in FIG. 2, the silicon wafer is polished to the nitride liner 6. Then, as shown in FIG. 3, a selective etch of the silicon wafer 1 exposes the nitride liner 6 further. Next, as shown in FIG. 4, the exposed nitride liner is removed by selective etch. The removal of the nitride liner creates a raised oxide ring 9 surrounding each chip 8.

Figure 5:
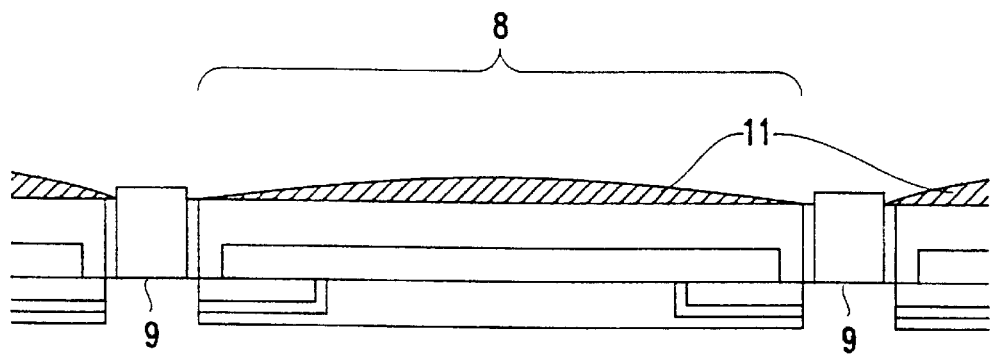
FIG. 5 is a cross sectional view of the wafer after application of adhesive (FIG. 5 being rotated 180° from the orientation shown in FIG. 4)

FIG. 5 shows a die by die application of epoxy or other adhesive 11. To apply the adhesive, the wafer is rotated and the adhesive 11 is applied to each chip 8. On application, the adhesive forms a meniscus. The volume of the adhesive 11 is controlled so that the adhesive will not flow over the raised oxide ring once devices are stacked.

Figure 6:
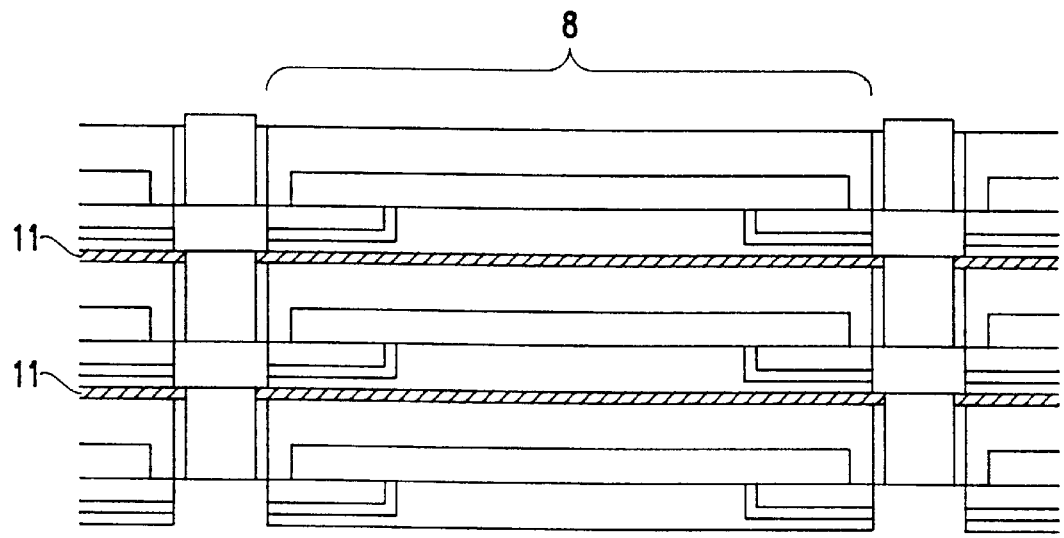
FIG. 6 is a cross sectional view of a laminated wafer structure.

FIG. 6 shows the last step, where wafers are stacked and laminated. The chips 8 are matched up using notches on the edges of the wafer. These notches 12 are shown in FIG. 7. In FIG. 7, notches 12 are shown at 120° angles around the periphery of the wafer 1. The specific location of these notches is not important. However, the notches do need to be placed in the same location on each wafer so that chip areas are matched during lamination.

In order to properly match the wafers which will be stacked, notches are preferably formed in a first wafer. After the notches are formed, the wafer is placed in a stepper which puts down a pattern and sets an alignment mark relative to the notches. In all subsequent wafers processed for stacking, alignment marks are made according to the settings calculated by the first wafer processed. The ability to line up the device regions accurately is important in reducing the number of chips which fail and increasing sidewall wire density. Accordingly the circuits on each wafer should be aligned to the alignment mark.

After lamination, the integrated circuit chip stacks are separated. In one embodiment, the wafer may be dip etched in hydrogen fluoride (HF) or solutions of HF (including HF diluted with water and buffered HF having $NH_4F$) to separate the individual stacks. In a second embodiment dicing could be performed or dicing followed by a dip etch. FIG. 7 shows separation of the stacks of chips 8 occurs along the trenches 5. Because the wafers have been aligned and laminated, separation produces stacks of laminated chips from the wafer. Hence, several stacks are formed simultaneously.

A dress up polish of the sides of the stacks to be face wired is then performed to remove any minor chip defects to chip misalignment that the process may introduce.

An unlimited number of wafers may be stacked in this process. The number of wafers stacked is determined by the amount of working chips needed in a stack. Accounting for yield loss during processing will raise the number of stacks which are usable after processing. Following wafer processing, a certain number of chips on the wafer will likely fail. In addition, some chips may go bad during the stacking process. Both types of yield loss should be accounted for when stacking wafers. For example, if stacks of ten working integrated circuits are required, stacking only ten wafers to form stacks of chips may result in less than 50% of the resulting stacks being usable for the desired application, based on a typical yield 70% per wafer. Due to the random distribution of defective chips on a wafer, an amount is stacked to provide for redundancy to take possible bad chips into account. During wiring, chips are tested and accounted for so that the stack still may be used, despite one or more defective chips.

While the invention has been described in terms of its preferred embodiments, those skilled in the art will recognize that the invention can be practiced with modification within the spirit and scope of the appended claims.

We claim:

1. A method of forming a plurality of semiconductor chip stacks comprising the steps of:

providing a plurality of wafers each having a plurality of chip regions formed therein each of which are surrounded by chip separation regions;

joining said plurality of wafers together to form a wafer stack with said chip regions and chip separation regions on said wafers in said wafer stack being in alignment; and then separating a plurality of stacks of chips from said wafer stack, each of said plurality of stacks of chips being comprised of a plurality of chips arranged in a stack, each of said plurality of chips being formed from individual chip regions of said plurality of chip regions in each wafer, said step of separating causing a separation of a stack of chips from said wafer stack at said chip separation regions which are aligned during said joining step wherein said chip separation regions in said wafer are comprised of insulator filled trenches.

2. The method of claim 1 wherein said step of separating is performed by dicing.

3. The method of claim 1 wherein said step of separating is performed by etching.

4. The method of claim 1 wherein said step of separating is performed by dicing and etching.

5. The method of claim 1 wherein said step of joining is performed by laminating.

6. The method of claim 5 further comprising the step of applying an adhesive to surfaces of said wafers prior to laminating.

7. The method of claim 1 further comprising the steps of:

forming notches in a first wafer of said plurality of wafers;

marking said first wafer with a pattern matched to said notches and recording said pattern;

marking each of said plurality of wafers with said pattern; and aligning said pattern on each of said plurality of said wafers, prior to said joining step.

8. The method of claim 7 further comprising the step of forming notches on the periphery of said wafers.

9. The method of claim 1 further comprising the steps:

removing a portion of said wafers from a surface of said wafers whereby said chip separation regions extend from a top to a bottom of said wafers and project above said surface of said wafers; and aligning said chip separation regions on said wafers.

10. The method of claim 9 further comprising the step of depositing an adhesive on said surface of said wafers after said removing step.

11. A method comprising the steps of:

providing a plurality of wafers each having a plurality of circuit areas thereon, each of the wafers having a frontside and a backside, and each of the circuit areas surrounded by an oxide-filled trench;

depositing an adhesive onto the backside of at least one of the circuits areas;

laminating with the adhesive the plurality of wafers frontside to backside; and separating a stack of the circuit areas formed by the laminating step including removing oxide surrounding the circuit areas in the stack.

12. The method of claim 11 further comprising the step of:

forming a plurality of raised oxide rings on the backside of the wafers each coextensive with the oxide-filled trench; and wherein the depositing step includes depositing the adhesive within a perimeter formed by at least one of the raised oxide rings.

* * * * *